(12) United States Patent
Charles et al.

(10) Patent No.: US 6,462,621 B1
(45) Date of Patent: Oct. 8, 2002

(54) OPERATIONAL AMPLIFIER THAT IS CONFIGURABLE AS A PROGAMMABLE GAIN AMPLIFIER OF A GENERAL PURPOSE AMPLIFIER

(75) Inventors: Michael Charles; Miguel Moreno; Keith Curtis, all of Gilbert, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 09/964,762

(22) Filed: Sep. 27, 2001

(51) Int. Cl.[7] ............................................. H03G 3/12
(52) U.S. Cl. ...................................... 330/282; 330/284
(58) Field of Search ................................. 330/282, 284

(56) References Cited

U.S. PATENT DOCUMENTS 4,132,957 A * 1/1979 Hekimian et al. ............ 330/51
5,973,566 A * 10/1999 Leiby ........................ 330/282
6,147,558 A * 11/2000 Sculley ....................... 330/284

* cited by examiner

Primary Examiner—Michael B Shingleton
(74) Attorney, Agent, or Firm—Baker Botts L.L.P.

(57) ABSTRACT

An amplifier may be configured as a general purpose operational amplifier having external gain determining components or as a programmable gain amplifier having self-contained gain determining components and fixed step amplification selection. Configuration and control of the operational amplifier may be performed with a digital processor such as a microcontroller. The configurable amplifier may be packaged in an integrated circuit package. The configurable amplifier and a processor may be fabricated on a single integrated circuit or in a multi-chip integrated circuit package.

30 Claims, 3 Drawing Sheets

OPERATIONAL AMPLIFIER THAT IS CONFIGURABLE AS A PROGAMMABLE GAIN AMPLIFIER OF A GENERAL PURPOSE AMPLIFIER

FIELD OF THE INVENTION

This invention relates to analog amplifiers and digital controllers having analog input operating parameters, and, more particularly, to an operational amplifier that is configurable as a programmable gain amplifier or a general purpose amplifier, and to a single monolithic device such as an integrated circuit die or multi-chip package comprising a microcontroller and/or a digital signal processor (DSP) in combination with at least one analog operational amplifier that is configurable as a programmable gain amplifier or a general purpose amplifier.

BACKGROUND OF THE INVENTION TECHNOLOGY

Analog amplifiers and digital controllers are becoming more sophisticated while continuing to drop in price. More and more consumer and commercial products, such as for example but not limited to, appliances, telecommunications devices, automobiles, security systems, full-house instant hot water heaters, lighting control, thermostats, humidistats, sprinkler control systems and the like are being operated by these digital controllers.

Analog inputs for receiving sensor information are necessary for the application of these controllers. Heretofore separate and discrete analog interfaces were used to connect a digital controller to the outside world. Digital controllers were created from programmable logic arrays (PLA), field or mask programmable gate arrays (FPGA or PGA), microcontrollers or digital signal processors (DSP) in combination with software or firmware programs.

Analog input devices such as analog-to-digital converters (ADC) in conjunction with a separate operational amplifier were used to convert a time-varying analog signal into digital representations thereof for application to digital inputs of the digital controller and use thereof. Voltage and current levels were also detected by discrete integrated circuit voltage comparators that changed a digital output state when a certain analog value was present on the input of the comparator. Analog control outputs were generated by digital-to-analog converters (DAC) in combination with the digital controller.

Technology has now advanced to the point where the analog input and output devices can be fabricated on the same integrated circuit die or multi-chip package (MCP) as the digital controller, thus producing mixed signal integrated circuits. Mixed signal integrated circuits reduce the cost, size and power consumption of controller systems. There are a large number of different applications and requirements for control systems, therefore an integrated circuit controller must have a great deal of flexibility and capability for use in various systems configurations. To be cost effective, the integrated circuit controller should be mass-produced as a single monolithic device. Analog input peripheral devices of the integrated circuit controller must interface with analog signals that may have a wide range of voltage and/or current levels. Since there are so many different types of analog signals, many different types of analog amplifiers (operational amplifiers are required because it is difficult to add programmable gain amplifier (PGA) to a general purpose operational amplifier (Op Amp) without affecting the performance of the Op Amp. Increasing the flexibility of an analog amplifier also increases its design complexity.

What is needed is an analog amplifier, and/or a digital controller having an analog amplifier(s) that may be configured as a PGA or a general purpose operational amplifier without operational degradation or increased circuit complexity of the analog amplifier.

SUMMARY OF THE INVENTION

The invention overcomes the above-identified problems as well as other shortcomings and deficiencies of existing technologies by providing an analog amplifier that may be configured as a PGA or a general purpose Op Amp, or an analog amplifier that may be configured as a PGA or a general purpose Op Amp and a digital controller fabricated as a single monolithic device such as an integrated circuit semiconductor die or a multi-chip package (MCP). An Op Amp in combination with digital logic controlled analog switches and gain setting resistors allows the Op Amp to be configured as a PGA or a general purpose Op Amp. The analog switches may be controlled by a processor (microcontroller, PLA, ASIC, DSP and the like) which may be fabricated on a different or the same integrated circuit die or in the MCP.

In accordance with an exemplary embodiment, the present invention is directed to a system for a processor and configurable amplifier system, said system comprising: a processor; an amplifier having an input and an output; a first switch having a plurality of inputs and an output; a second switch having an input and an output; said first and second switches controlled by said processor; a plurality of gain determining elements connected to the inputs of said first and second switches; said second switch output coupled to the output of said amplifier; and said first switch output coupled to the input of said amplifier; wherein said amplifier is configured as a general purpose amplifier without gain determining elements connected thereto when said first switch selects a first one of the plurality of inputs and said second switch is off, and said amplifier is configured as a programmable gain amplifier when said first switch selects any other one of the plurality of inputs and said second switch is on, whereby said gain determining elements determine the gain of said amplifier.

The present invention is also directed to a method of operation for configuring an operational amplifier as either a programmable gain amplifier or a general purpose amplifier, said method comprising the steps of: providing a processor; providing an amplifier having an input and an output; providing a first switch having a plurality of inputs and an output; providing a second switch having an input and an output; controlling said first and second switches with said processor; providing a plurality of gain determining elements connected to the inputs of said first and second switches; coupling said second switch output to the output of said amplifier; coupling said first switch output to the input of said amplifier; configuring said amplifier as a general purpose amplifier without gain determining elements connected thereto when said first switch selects a first one of the plurality of inputs and said second switch is off; and configuring said amplifier as a programmable gain amplifier when said first switch selects any other one of the plurality of inputs and said second switch is on, whereby said gain determining elements determine the gain of said amplifier.

The present invention is also directed to an apparatus for a configurable amplifier, said configurable amplifier comprising: an amplifier having an input and an output; a first switch having a plurality of inputs and an output; a second switch having an input and an output; said first and second switches are adapted for digital control; a plurality of gain determining elements connected to the inputs of said first and second switches; said second switch output coupled to the output of said amplifier; and said first switch output coupled to the input of said amplifier; wherein said amplifier is configured as a general purpose amplifier without gain determining elements connected thereto when said first switch selects a first one of the plurality of inputs and said second switch is off, and said amplifier is configured as a programmable gain amplifier when said first switch selects any other one of the plurality of inputs and said second switch is on, whereby said gain determining elements determine the gain of said amplifier.

A feature of the present invention is an analog programmable gain amplifier or a standard operational amplifier that may be configured using external gain setting components.

Still another feature is configuration of an analog programmable gain amplifier or a standard operational amplifier with a digital processor.

Another feature is access to the inputs and outputs of the analog amplifier to connect feedback components thereto.

Another feature is programmable access to the inputs and outputs of the analog amplifier to connect feedback components thereto.

Other and further features and advantages will be apparent from the following description of exemplary embodiments of the invention, given for the purpose of disclosure and taken in conjunction with the accompanying drawings.

BRIEF DESCRIPTION OF THE DRAWINGS

A more complete understanding of the present disclosure and advantages thereof may be acquired by referring to the following description taken in conjunction with the accompanying drawing, wherein.

DETAILED DESCRIPTION OF SPECIFIC EMBODIMENTS

Figure 1:
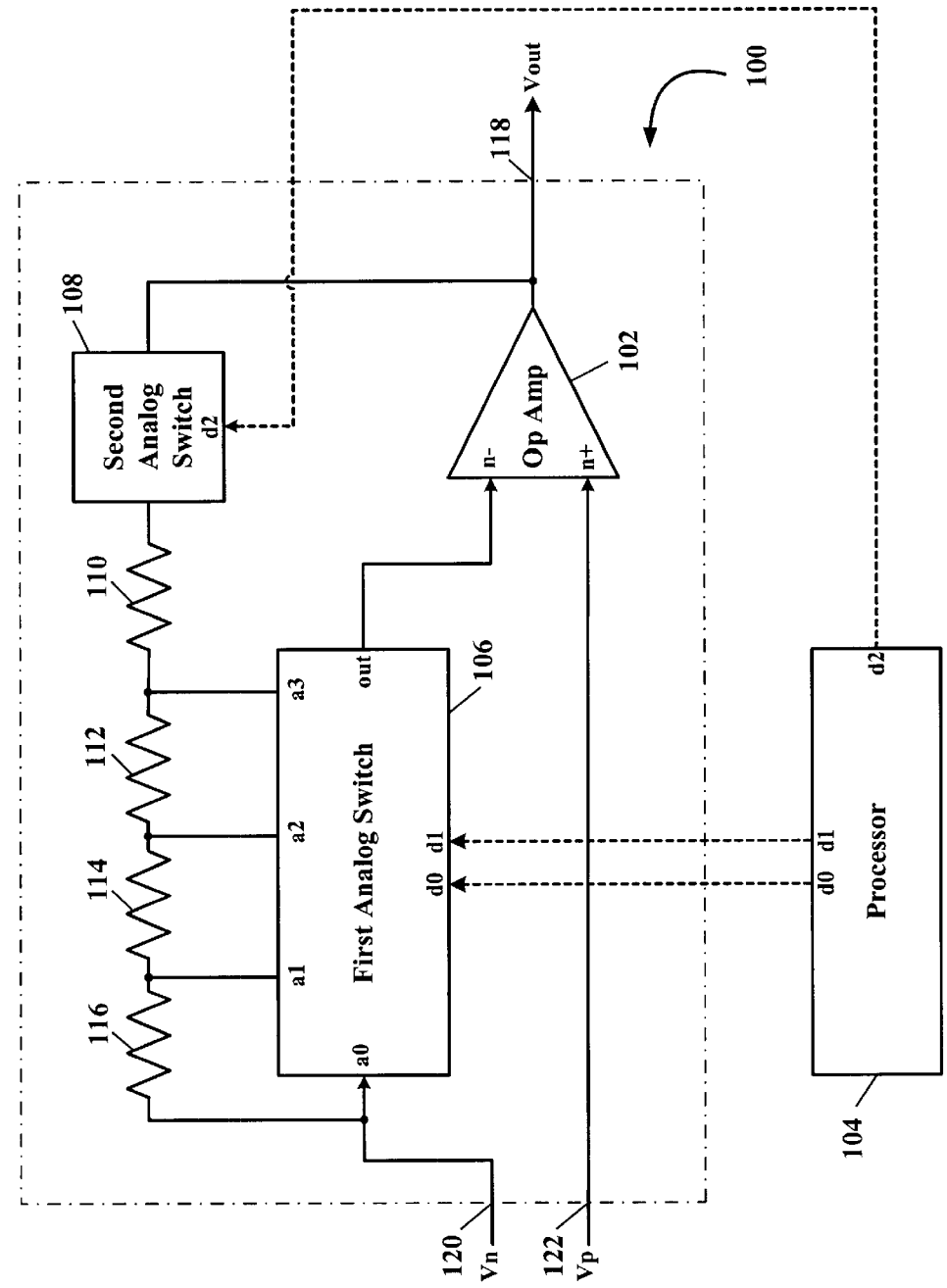
FIG. 1 is a schematic block diagram of an exemplary embodiment of a configurable operational amplifier, or the configurable operational amplifier in combination with a processor.

The present invention is directed to an operational amplifier that is configurable as a programmable gain amplifier (PGA) or a general purpose operational amplifier, and, in addition may be fabricated with a digital controller on a single monolithic device such as an integrated circuit semiconductor die or as a multi-chip package (MCP). The digital controller may comprise a digital processor, e.g., microcontroller, microprocessor, digital signal processor (DSP), programmable logic array (PLA), application specific integrated circuit (ASIC), etc. The configurable amplifier may comprise an operational amplifier in combination with analog switches and gain setting components. The digital controller and configurable amplifier may be fabricated on a single monolithic device such as an integrated circuit semiconductor die or in a multi-chip package (MCP).

Referring now to the drawings, the details of exemplary embodiments of the invention are schematically illustrated. Like elements in the drawings will be represented by like numbers, and similar elements will be represented by like numbers with a different lower case letter suffix.

Referring to FIG. 1, depicted is a schematic block diagram of an exemplary embodiment of a configurable operational amplifier, or the configurable operational amplifier in combination with a processor. The configurable operational amplifier is generally represented by the numeral 100, and comprises a differential input, single ended output, operational amplifier (Op Amp) 102; a first analog switch 106, a second analog switch 108, and gain setting resistors 110–116. External digital control signals (not illustrated) or a processor 104 may be used to control the first and second switches 106, 108 for configuring the configurable operational amplifier 100.

The configurable operational amplifier 100 is adapted for a negative analog voltage input 120 (Vn), a positive analog voltage input 122 (Vp) and a single ended analog output 118 (Vout). The negative input 120 is coupled to a first input, a0, of the first analog switch 106. The positive input 122 is coupled to a positive input, n+, of the Op Amp 102. A negative input, n−, of the Op Amp 102 is coupled to an output of the first analog switch 106.

The first analog switch 106 is a single pole, four throw switch wherein one of the four inputs, a0–a3, is selectively coupled to the output (out). The second analog switch 108 is a single pole, single throw switch that either connects or disconnects one end of the resistor 110 to the output of the Op Amp 102. The microcontroller 104 may control the first analog switch 106 through control signals d0 and d1, and the second analog switch 108 through its control signal d2. Analog signal paths are represented by solid lines and digital control signal paths are represented by dotted lines.

When the a0 input of the first analog switch 106 is selected (a0 is connected directly to out of the first analog switch 106) and the second analog switch 108 is open, the input 120, Vn, is connected directly to the negative input, n−, of the Op Amp 102 and there are no gain determining resistors ($R_i$ and $R_f$) connected to the Op Amp 102. In this configuration, the Op Amp 102 may be used as a general purpose operational amplifier having external components, e.g., resistors and/or capacitors, connected to the inputs 120 or 122, and output 118.

When a simple gain stage is desired, a programmable gain amplifier (PGA) may be configured by closing the second analog switch 108 and selecting one of the first analog switch 106 inputs, a1–a3. Resistor 110 is now connected from the output of the Op Amp 102 in a feedback gain determining circuit in combination with resistors 112, 114 and 116. The gain may be determined by the ratio of the resistance values of the feedback resistor, $R_f$, divided by the input resistor, $R_i$, wherein the feedback resistor is connected from the output of the operation amplifier to an input of the operational amplifier, and the input resistor is connected between a signal input and the input of the operational amplifier. The output voltage may be determined by:

$$Vout = Vp + R_f*(Vp-Vn)/R_i$$

where Vp is the positive voltage input 122, Vn is the negative voltage input 120, Vout is the voltage at the output 118, $R_i$ is the input resistance and $R_f$ is the feedback resistance.

The series resistance of the second analog switch 108 may also contribute to the total resistance $R_f$. The first analog switch 106 is in the high impedance input circuit of the Op Amp 102 so its contribution to series input resistance is negligible ($R_i$ is connected directly to $R_f$ without having to go through any switches). In the exemplary embodiment of the present invention shown in FIG. 1, three programmable gain configurations are possible, depending upon which of the inputs a1–a3 is selected. For example.

| Control d2d1d0 | $R_i$ | $R_f$ | First Switch | Second Switch |
|---|---|---|---|---|
| 000 | External | External | a0 | Open |
| 101 | R116 | R114 + R112 + R110 | a1 | Closed |
| 110 | R116 + R114 | R112 + R110 | a2 | Closed |
| 111 | R116 + R114 + R112 | R110 | a3 | Closed |

As noted hereinabove, the on (closed) resistance of the second switch 108 may be added to the value of $R_f$ for a more accurate determination of the gain of the PGA configuration. It is contemplated and within the scope of the present invention that a greater or fewer number of gain determining resistors (greater or fewer switched inputs of the first analog seitch 106) may be used with the present invention for greater or fewer selectable gain steps. The present invention thus minimizes the number of switches that are in a low resistance path so as to minimize errors in the PGA mode.

Figure 2:
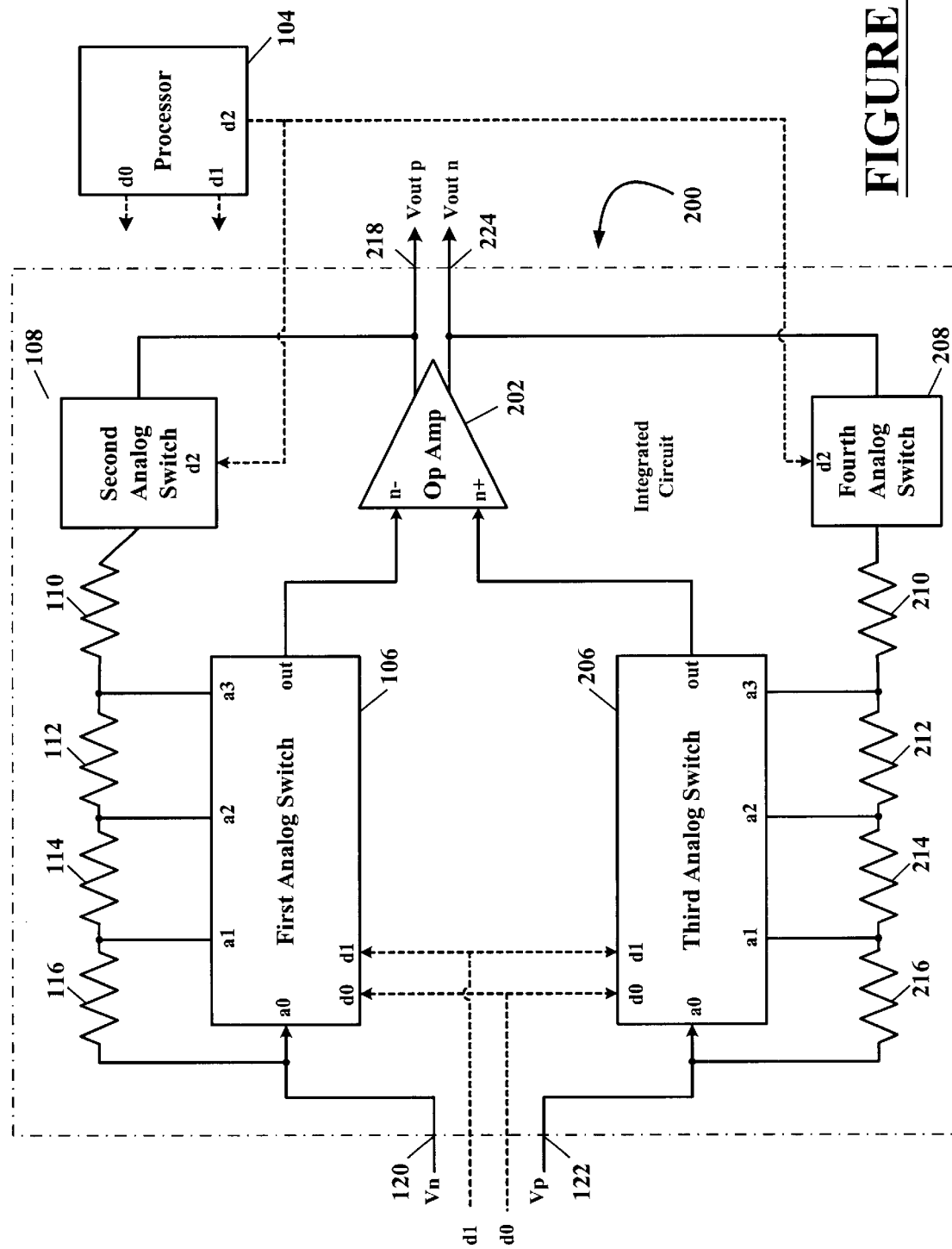
FIG. 2 is a schematic block diagram of another exemplary embodiment of a configurable operational amplifier, or the configurable operational amplifier in combination with a processor.

Referring now to FIG. 2, depicted is a schematic block diagram of another exemplary embodiment of a configurable operational amplifier, or the configurable operational amplifier in combination with a processor. The configurable operational amplifier is generally represented by the numeral 200, and comprises a fully differential input and output operational amplifier (Op Amp) 202, a first analog switch 106, a second analog switch 108, a third analog switch 206, a fourth analog switch 208, and gain setting resistors 110–116 and 210–216. The third analog switch 206 in combination with the gain setting resistors 210–216 are connected between the positive input, n+ of the Op Amp 202 and the positive input 122, Vp, and operate is the same fashion as the first analog switch 106 and gain setting resistors 110–116. The fourth analog switch 208 operates in the same fashion as the second analog switch 108.

When the a0 inputs of the first analog switch 106 and third analog switch 206 are selected (a0 is connected directly to out of the first and third analog switches 106, 206) and the second and fourth analog switches 108, 208 are open, the input 120, Vn, is connected directly to the negative input, n−, the input 122, Vp, is connected directly to the positive input, n+, and there are no gain determining resistors ($R_i$ and $R_f$) connected to the Op Amp 202. In this configuration, the Op Amp 202 may be used as a general purpose Op Amp having externally connected components connected to the inputs 120, 122, and outputs 218, 224.

When a simple gain stage is desired, a programmable gain amplifier (PGA) may be configured by closing the second and fourth analog switches 108, 208 and selecting one of the first and third analog switches 106, 206 inputs, a1–a3, as described hereinabove.

The configurable operational amplifiers 100 and/or 200 illustrated in FIGS. 1 and 2, respectively, may also be fabricated in an integrated circuit without the processor 104. External digital control of the configurable operational amplifier in an integrated circuit package may be used and is contemplated herein. A plurality of configurable operational amplifiers, according to exemplary embodiments of the present invention, in an integrated circuit package with or with a controlling processor 104 is also contemplated herein.

The analog switches 106, 108, 206 and 208 may be fabricated from P-channel MOSFET and N-channel MOSFET transistors, bipolar transistors, etc. The operational amplifier 102, 202 may be of any design known in the art of analog circuits. The processor 104 may comprise any type of digital logic circuits.

The integrated circuit controller may also include other analog devices having a digital interface (input or output), e.g., an analog-to-digital converter (ADC), a digital-to-analog converter (DAC), a comparator, etc., (not shown). These analog devices may be used to interface with the processor 104, and the configurable amplifier 100 and/or 200 may be used as an analog amplifier either before or after these other analog devices.

Figure 3:
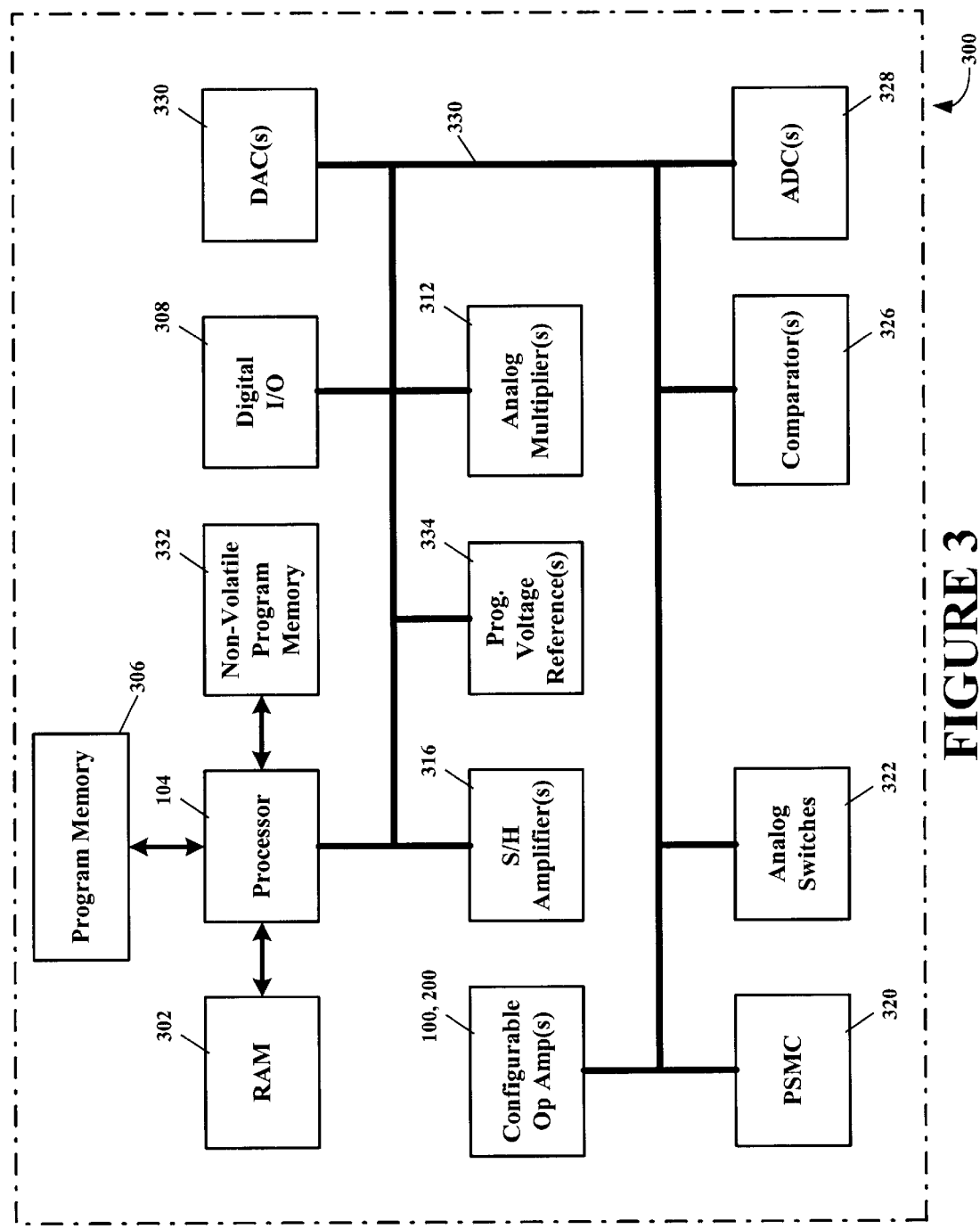
FIG. 3 is a schematic block diagram of a controller system comprising a processor in combination with analog and digital peripherals, and input-output functions on a single semiconductor integrated circuit die or in a multi-chip package (MCP)

Referring to FIG. 3, a schematic block diagram of a controller system comprising a processor in combination with integral analog and digital peripherals (e.g., configurable operational amplifier) and input-output functions on a single semiconductor integrated circuit die or in a multi-chip package (MCP) is illustrated. The block diagram of FIG. 3 is illustrative of a representative controller system on an integrated circuit die or in a MCP and is generally represented by the numeral 300. The controller system 300 comprises a random access memory (RAM) 302, a processor 104, a program memory 306, a non-volatile program memory 332, digital input-output (I/0) 308, a digital-to-analog converter(s) (DAC) 310, an analog multiplier(s) 312, a programmable voltage reference(s) 314, a sample and hold amplifier(s) 316, a configurable analog amplifier(s) 100, 200, a programmable switched mode controller (PSMC) 320, analog switches 322, a comparator(s) 326 and an analog-to-digital converter(s) (ADC) 328. It is contemplated and within the scope of the present invention that more than one of any or all of the aforementioned peripherals may be included in the controller system 300. The processor 104 may control any or all of the aforementioned devices on a data and control bus 330 which may be internal to the integrated circuit die or MCP. The processor 104 may also be coupled to the RAM 302 and program memory 306 on the same or other higher speed memory bus(es). The program memory 306 may be for example, but not limited to, electrically programmable read only memory (EPROM), read only memory (ROM), electrically erasable and programmable read only memory (EEPROM/FLASH) and the like. Not illustrated but contemplated and within the scope of the present invention are certain general digital peripherals used in combination with the processor 104. These general digital peripherals may be for example, but not limited to, timers, UART/USART, $I^2C$, SPI, or other types of communications peripherals well known to those skilled in the art of digital electronics. The non-volatile data memory may be used, for example but not limited to, storing calibration data, device/product identity, etc.

Other advantageous uses and applications of the present invention may be found in commonly owned U.S. patent applications: U.S. Ser. No. 09/675,355, filed Sep. 29, 2000, entitled "Comparator Programmable for High-Speed or Low-Power Operation" by Hartono Darmawaskita and Miguel Moreno; U.S. Ser. No. 09/676,389, filed Sep. 29, 2000, entitled "Auto-Calibration Circuit to Minimize Input Offset Voltage in an Integrated Circuit Analog Input Device" by Hartono Darmawaskita, Layton Eager and Miguel Moreno; U.S. Ser. No. 09/675,356, filed Sep. 29, 2000, entitled "Input Voltage Offset Calibration of an Analog Device Using a Microcontroller" by Hartono Darmawaskita, Layton Eager and Miguel Moreno; and U.S. Ser. No. 09/707,091, filed Nov. 6, 2000, entitled "Configurable Mixed Analog and Digital Mode Controller System" by Hartono Darmawaskita, Ryan Scott Ellison, Randy L. Yach and Miguel Moreno, all being hereby incorporated by reference herein for all purposes.

The controller system 300 may be fabricated on one or more integrated circuit dice and enclosed in an integrated circuit package. The integrated circuit package may be, for example, but is not limited to, plastic dual in-line package (PDIP), small outline (SO), shrink small outline package (SSOP), thin shrink small outline package (TSSOP), windowed ceramic dual in-line package (CERDIP), leadless chip carrier (LCC), plastic leaded chip carrier (PLCC), plastic quad flatpack package (PQFP), thin quad flatpack package (TQFP), pin grid array (PGA), ball grid array (BGA), TO-220, TO-247, TO-263 and the like.

The invention, therefore, is well adapted to carry out the objects and attain the ends and advantages mentioned, as well as others inherent therein. While the invention has been depicted, described and is defined by reference to exemplary embodiments of the invention, such references do not imply a limitation on the invention, and no such limitation is to be inferred. The invention is capable of considerable modification, alternation and equivalents in form and function, as will occur to those ordinarily skilled in the pertinent arts and having the benefit of this disclosure. The depicted and described embodiments of the invention are exemplary only and are not exhaustive of the scope of the invention. Consequently, the invention is intended to be limited only by the spirit and scope of the appended claims, giving full cognizance to equivalents in all respects.

What is claimed is:

1. A processor and configurable amplifier system, said system comprising:
    a processor;
    an amplifier having an input and an output;
    a first switch having a plurality of inputs and an output;
    a second switch having an input and an output;
    said first and second switches controlled by said processor;
    a plurality of gain determining elements connected to the inputs of said first and second switches;
    said second switch output coupled to the output of said amplifier; and
    said first switch output coupled to the input of said amplifier;
    wherein said amplifier is configured as a general purpose amplifier without gain determining elements connected thereto when said first switch selects a first one of the plurality of inputs and said second switch is off, and said amplifier is configured as a programmable gain amplifier when said first switch selects any other one of the plurality of inputs and said second switch is on, whereby said gain determining elements determine the gain of said amplifier.

2. The system of claim 1, wherein said processor is a microcontroller.

3. The system of claim 1, wherein said processor is a digital signal processor.

4. The system of claim 1, wherein said processor comprises a microcontroller and a digital signal processor.

5. The system of claim 1, wherein said processor, said amplifier, said first switch, said second switch and said plurality of gain determining elements are fabricated on an integrated circuit die.

6. The system of claim 5, further comprising an integrated circuit package enclosing said integrated circuit die.

7. The system of claim 6, wherein said integrated circuit package is selected from a group consisting of plastic dual in-line package (PDIP), small outline (SO), shrink small outline package (SSOP), thin shrink small outline package (TSSOP), windowed ceramic dual in-line package (CERDIP), leadless chip carrier (LCC), plastic leaded chip carrier (PLCC), plastic quad flatpack package (PQFP), thin quad flatpack package (TQFP), pin grid array (PGA), ball grid array (BGA), TO-220, TO-247 and TO-263.

8. The system of claim 1, wherein said amplifier is an operational amplifier.

9. The system of claim 8, wherein said operational amplifier has a differential input and a single ended output.

10. The system of claim 1, further comprising:
    said amplifier having first and second inputs, and first and second outputs;
    a third switch having a plurality of inputs and an output;
    a fourth switch having an input and an output;
    said third and fourth switches controlled by said processor;
    a second plurality of gain determining elements connected to the inputs of said third and fourth switches;
    said second switch output coupled to the first output of said amplifier;
    said first switch output coupled to the first input of said amplifier;
    said fourth switch output coupled to the second output of said amplifier; and
    said third switch output coupled to the second input of said amplifier;
    wherein said amplifier is configured as a general purpose amplifier without gain determining elements connected thereto when said first and third switches select a first one of the plurality of inputs and said second and fourth switches are off, and said amplifier is configured as a programmable gain amplifier when said first and third switches select any other one of the plurality of inputs and said second and fourth switches are on, whereby said gain determining elements determine the gain of said amplifier.

11. The system of claim 10, wherein said amplifier is an operational amplifier.

12. The system of claim 11, wherein said operational amplifier has a differential input and a differential output.

13. A method for configuring an operational amplifier as either a programmable gain amplifier or a general purpose amplifier, said method comprising the steps of:
    providing a processor;
    providing an amplifier having an input and an output;
    providing a first switch having a plurality of inputs and an output;
    providing a second switch having an input and an output;
    controlling said first and second switches with said processor;
    providing a plurality of gain determining elements connected to the inputs of said first and second switches;
    coupling said second switch output to the output of said amplifier;
    coupling said first switch output to the input of said amplifier;
    configuring said amplifier as a general purpose amplifier without gain determining elements connected thereto when said first switch selects a first one of the plurality of inputs and said second switch is off; and configuring said amplifier as a programmable gain amplifier when said first switch selects any other one of the plurality of inputs and said second switch is on, whereby said gain determining elements determine the gain of said amplifier.

14. The method of claim 13, wherein said processor is a microcontroller.

15. The method of claim 13, wherein said processor is a digital signal processor.

16. The method of claim 13, further comprising the step of fabricating said processor, said amplifier, said first switch, said second switch and said plurality of gain determining elements on an integrated circuit die.

17. The method of claim 16, further comprising the step of enclosing said integrated circuit die in an integrated circuit package.

18. The method of claim 17, wherein said integrated circuit package is selected from a group consisting of plastic dual in-line package (PDIP), small outline (SO), shrink small outline package (SSOP), thin shrink small outline package (TSSOP), windowed ceramic dual in-line package (CERDIP), leadless chip carrier (LCC), plastic leaded chip carrier (PLCC), plastic quad flatpack package (PQFP), thin quad flatpack package (TQFP), pin grid array (PGA), ball grid array (BGA), TO-220, TO-247 and TO-263.

19. The method of claim 13, wherein said amplifier is an operational amplifier.

20. The method of claim 19, wherein said operational amplifier has a differential input and a single ended output.

21. The method of claim 13, further comprising the steps of:
providing said amplifier with first and second inputs, and first and second outputs;
providing a third switch having a plurality of inputs and an output;
providing a fourth switch having an input and an output;
controlling said third and fourth switches with said processor;
providing a second plurality of gain determining elements connected to the inputs of said third and fourth switches;
coupling second switch output to the first output of said amplifier;
coupling said first switch output to the first input of said amplifier;
coupling said fourth switch output to the second output of said amplifier; and
coupling said third switch output to the second input of said amplifier;
configuring said amplifier as a general purpose amplifier without gain determining elements connected thereto when said first and third switches select a first one of the plurality of inputs and said second and fourth switches are off; and
configuring said amplifier as a programmable gain amplifier when said first and third switches select any other one of the plurality of inputs and said second and fourth switches are on, whereby said gain determining elements determine the gain of said amplifier.

22. A configurable amplifier, comprising:
an amplifier having an input and an output;
a first switch having a plurality of inputs and an output;
a second switch having an input and an output;
said first and second switches are adapted for digital control;
a plurality of gain determining elements connected to the inputs of said first and second switches;
said second switch output coupled to the output of said amplifier; and
said first switch output coupled to the input of said amplifier;
wherein said amplifier is configured as a general purpose amplifier without gain determining elements connected thereto when said first switch selects a first one of the plurality of inputs and said second switch is off, and said amplifier is configured as a programmable gain amplifier when said first switch selects any other one of the plurality of inputs and said second switch is on, whereby said gain determining elements determine the gain of said amplifier.

23. The configurable amplifier of claim 22, wherein said amplifier is an operational amplifier.

24. The configurable amplifier of claim 23, wherein said operational amplifier has a differential input and a differential output.

25. The configurable amplifier of claim 22, wherein said amplifier, said first switch, said second switch and said plurality of gain determining elements are fabricated on an integrated circuit die.

26. The configurable amplifier of claim 25, further comprising an integrated circuit package enclosing said integrated circuit die.

27. The configurable amplifier of claim 26, wherein said integrated circuit package is selected from a group consisting of plastic dual in-line package (PDIP), small outline (SO), shrink small outline package (SSOP), thin shrink small outline package (TSSOP), windowed ceramic dual in-line package (CERDIP), leadless chip carrier (LCC), plastic leaded chip carrier (PLCC), plastic quad flatpack package (PQFP), thin quad flatpack package (TQFP), pin grid array (PGA), ball grid array (BGA), TO-220, TO-247 and TO-263.

28. The configurable amplifier of claim 22, further comprising:
said amplifier having first and second inputs, and first and second outputs;
a third switch having a plurality of inputs and an output;
a fourth switch having an input and an output;
said third and fourth switches are adapted for digital control;
a second plurality of gain determining elements connected to the inputs of said third and fourth switches;
said second switch output coupled to the first output of said amplifier;
said first switch output coupled to the first input of said amplifier;
said fourth switch output coupled to the second output of said amplifier; and
said third switch output coupled to the second input of said amplifier;
wherein said amplifier is configured as a general purpose amplifier without gain determining elements connected thereto when said first and third switches select a first one of the plurality of inputs and said second and fourth switches are off, and said amplifier is configured as a programmable gain amplifier when said first and third switches select any other one of the plurality of inputs and said second and fourth switches are on, whereby said gain determining elements determine the gain of said amplifier.

29. The configurable amplifier of claim 28, wherein said amplifier is an operational amplifier.

30. The configurable amplifier of claim 29, wherein said operational amplifier has a differential input and a differential output.

* * * * *